United States Patent [19]

Luderer et al.

[11] 4,250,385
[45] Feb. 10, 1981

[54] SEMICONDUCTOR X-RAY DETECTOR

[75] Inventors: Gunter Luderer, Eltersdorf; Burghard Weinkauf; Reiner Liebetruth, both of Erlangen, all of Fed. Rep. of Germany

[73] Assignee: Siemens Aktiengesellschaft, Berlin & Munich, Fed. Rep. of Germany

[21] Appl. No.: 940,562

[22] Filed: Sep. 8, 1978

Related U.S. Application Data

[63] Continuation of Ser. No. 777,917, Mar. 16, 1977, abandoned.

[30] Foreign Application Priority Data

May 20, 1976 [DE] Fed. Rep. of Germany ....... 2622655

[51] Int. Cl.³ .......................... G01T 1/20; G01T 1/22
[52] U.S. Cl. ................................. 250/363 S; 250/370
[58] Field of Search .............. 250/361, 366, 370, 371, 250/363 S

[56] References Cited

U.S. PATENT DOCUMENTS

| | | | |
|---|---|---|---|
| 2,190,200 | 2/1940 | Victoreen | 250/361 |
| 3,612,869 | 10/1971 | Baum et al. | 250/370 |
| 3,904,879 | 9/1975 | Amigual et al. | 250/370 |
| 3,937,965 | 2/1976 | Vasseur | 250/366 |
| 3,940,626 | 2/1976 | Hounsfield | 250/366 |
| 4,119,841 | 10/1978 | Jantsch et al. | 250/370 |

*Primary Examiner*—Alfred E. Smith
*Assistant Examiner*—Janice A. Howell
*Attorney, Agent, or Firm*—Hill, Van Santen, Steadman, Chiara & Simpson

[57] ABSTRACT

In the illustrated embodiments a row of semiconductor diodes is provided with intervening fluorescent layers and with fluorescent layers at the opposite ends. The x-radiation may impinge on one end of the detector such that the additional layers provide increased sensitivity. In a second embodiment, the radiation impinges laterally of the detector so that each fluorescent layer receives an individual sample of the impinging radiation, and the output from respective diodes may be individually stored as a measure of the respective samples. In an illustrated x-ray tomographic apparatus, the edge faces of the fluorescent layers are equidistant from the focus of the x-ray tube so as to sample successive portions of a fan-shaped x-ray beam.

1 Claim, 4 Drawing Figures

X-Ray Generator

Measured Value Converter 007,917,
SEMICONDUCTOR X-RAY DETECTOR

This is a continuation of application Ser. No. 777,917, filed Mar. 16, 1977, now abandoned.

BACKGROUND OF THE INVENTION

The invention relates to a semiconductor x-ray detector with means for converting the x-rays into light and with a semiconductor assembly as optical-electrical converter.

A known semiconductor x-ray detector of this type consists of a semiconductor diode and a fluorescent layer overlying the diode and exposed to x-radiation at one lateral surface so as to convert the impinging radiation into visible light. The visible light is transmitted to the semiconductor diode at the opposite lateral side of the fluorescent layer for conversion into an electrical signal. With the use of polycrystalline fluorescent substances the absorption length for x-radiation is generally far greater than for light so that the quanta efficiency degree is low. It cannot even be substantially increased through enlargement of the thickness of the fluorescent layer. The sensitivity of the arrangement (which is illustrated in FIG. 1) is:

$E_1 = KD\eta_R \cdot \eta_0$, where

D is the dose rate of the x-ray source,
$\eta_R$ is the degree of x-ray efficiency,
$\eta_0$ is the degree of optical efficiency, and
K is the conversion factor.

The conversion factor can be improved by mirror-coating the reverse (e.g. lower side) of the semiconductor diode or by double coating.

SUMMARY OF THE INVENTION

It is a principal object of the invention to create a semiconductor x-ray detector of the type specified at the outset, the sensitivity of which is increased in comparison with the described prior art.

This object is solved in accordance with the invention in that it contains a row of separate semiconductor elements, and that between every two semiconductor elements respectively there is a fluorescent layer for converting the x-rays into light.

Other objects, features and advantages of the invention will be apparent from the following detailed description taken in connection with the accompanying sheet of drawings.

DESCRIPTION OF THE PREFERRED EMBODIMENTS

Figure 1:
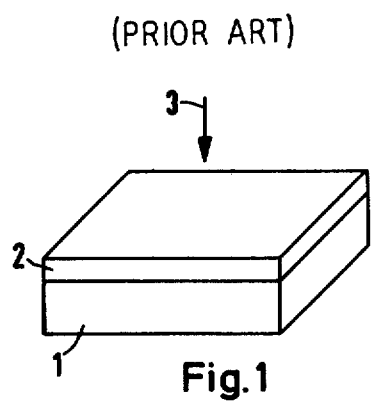
FIG. 1 is a diagrammatic perspective view showing a known semiconductor x-ray detector as referred to in the introduction hereto.

A known semiconductor x-ray detector is illustrated in FIG. 1. It consists of a semiconductor diode 1 and a fluorescent layer 2. If the detector according to FIG. 1 is penetrated by x-radiation in the direction of arrow 3, the x-radiation is converted in the fluorescent layer 2 into visible light which is converted by the semiconductor diode 1 into an electrical signal. The efficiency of this known semiconductor detector is discussed in the section hereof entitled Background of the Invention.

Figure 2:
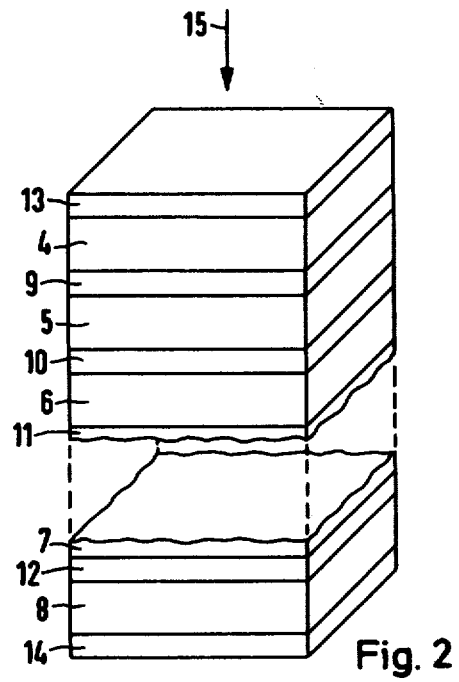
FIG. 2 is a fragmentary somewhat diagrammatic perspective view showing a first embodiment in accordance with the present invention.

The detector according to FIG. 2 consists of a row of semiconductor diodes 4, 5, 6, 7, 8, etc. Between every two semiconductor diodes, respectively, there is a fluorescent layer, the layer 9 being disposed between diodes 4 and 5, the layer 10 being disposed between diodes 5 and 6, and further fluorescent layers being indicated at 11 and 12, by way of example. FIG. 2 also shows fluorescent layers 13 and 14 arranged at the two ends of the row of semiconductor diodes, layer 13 overlying diode layer 4, and layer 14 being shown as following diode layer 8. In the case of the example according to FIG. 2, the x-radiation penetrates the detector in the direction of the arrow 15, that is the detector is penetrated by x-rays in the longitudinal direction thereof, all of the radiation to be measured impinging first on the fluorescent layer 13, radiation transmitted by the layers 13 and 4 impinging on the fluorescent layer 9, and so on.

The sensitivity of the semiconductor detector according to FIG. 2, as a function of the number N of the semiconductor diodes, is as follows:

$E_2 = KD\eta_0 [1-(1-\eta_R)^N]$

A comparison with the sensitivity of the detector according to FIG. 1 shows that the sensitivity has been increased considerably by the arrangement as shown in FIG. 2.

Figure 3:
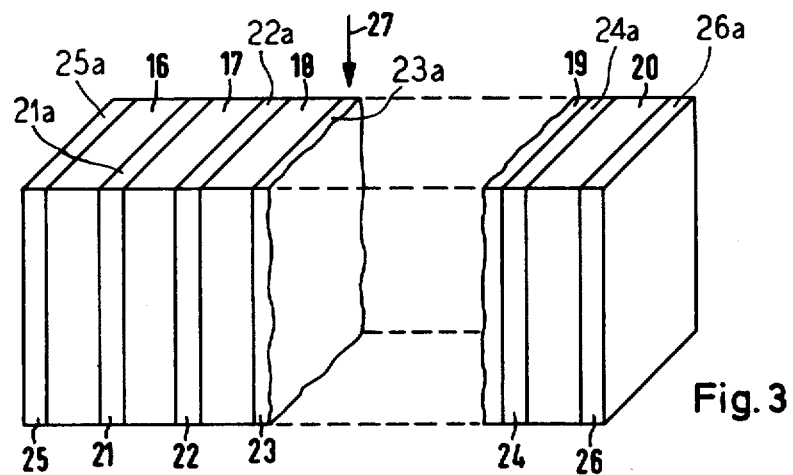
FIG. 3 is a diagrammatic fragmentary perspective view illustrating a second embodiment in accordance with the present invention.

The example according to FIG. 3 corresponds in its structure to the example according to FIG. 2. A row of semiconductor diodes 16, 17, 18, 19, 20, etc., is also provided here and there is a flourescent layer between every two diodes, layer 21 being shown between diodes 16 and 17, layer 22 being shown between diodes 17 and 18 and further fluorescent layers being indicated at 23 and 24, for example. Fluorescent layers 25 and 26 are shown as being arranged at each of the respective ends of the semiconductor row. In this embodiment, the x-radiation strikes the semiconductor detector in the direction of arrow 27, that is the semiconductor diode row is arranged with its longitudinal direction at right angles to the direction of the x-radiation as indicated by arrow 27. In this example, respective samples of the impinging radiation impinge on the respective edge faces 21a–26a of the fluorescent layers such as 21–26 directly without passing through other of the layers 16–26. The sensitivity of the semiconductor detector according to FIG. 3 is:

$E_3 = NKD \, A/A_0 \cdot \eta_0 (1-e^{-\mu b})$

Here $\mu$ is the x-ray absorption coefficient and the ratio $A/A_0$ is the ratio of the active to the irradiated area. The semiconductor detector according to FIG. 3 is particularly suitable for those cases in which a high local resolution is demanded. By way of example, the output of diode 16 may be taken as a measure of the x-ray energy impinging on the local area bounded by the edge faces 25a and 21a of fluorescent layers 25 and 21. Similarly, the output of diode 17 may be taken as a measure of the x-ray energy impinging on the area represented by the edge faces 21a and 22a of fluorescent layers 21 and 22, and so on.

Figure 4:
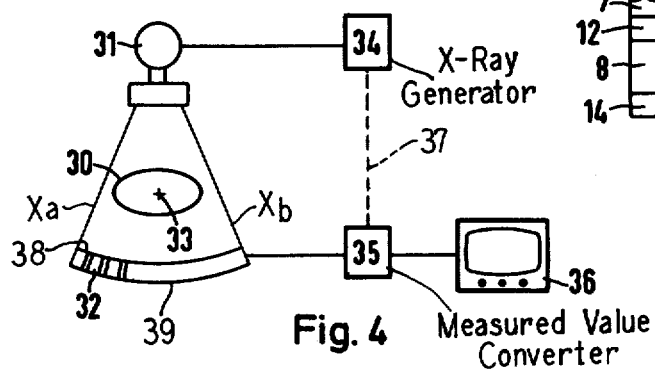
FIG. 4 is a diagrammatic view showing an example of application of the detector according to the present invention.

A semiconductor detector according to FIG. 3 is suitable for application in a tomographic apparatus such as indicated in FIG. 4 which is utilized for producing transverse layer images of a patient 30. This tomographic apparatus contains an x-ray tube 31 and a semiconductor detector 32 curved about the focus of the x-ray tube 31. The detector 32 may comprise alternate fluorescent layers and semiconductor diodes arranged as shown in FIG. 3 except that the longitudinal direction of the detector 32 is curved such that there is an equal distance between the focus of the x-ray tube 31 and each of the fluorescent layer edge faces such as indicated at 21a–26a in FIG. 3. In each of the embodiments, the successive layers such as 4–14 and 16–26 may be rigidly joined together, and such an arrangement is disclosed for the semiconductor detector 32 in FIG. 4.

The x-ray tube 31 produces a fan-shaped x ray beam with marginal rays such as diagrammatically indicated at $X_a$ and $X_b$, the extent of the beam in the direction of the longitudinal axis 33 of a patient 30 being equal to the desired layer thickness, and the beam irradiating the entire cross section of the patient 30 simultaneously, for example.

To produce a layer image, the measuring assembly 31, 32 is rotated around the patient 30 by 360 degrees and in so doing the x-ray tube 31 is periodically, for example at each degree of angle, switched on or pulsed momentarily by means of the x-ray generator 34. The signals received by the detector 32 are a measure of the transmitted radiation for each respective angular position of the measuring assembly 31, 32. The signals from the individual diodes for each angular position of the measuring assembly are passed to a measured value converter 35 which calculates the cross section image of the patient 30 from all of the output signals which result from the individual x-ray pulses, and effects its reproduction on a video display apparatus 36. The structural elements 34 and 35 are synchronized with one another as indicated by dash line 37 so that the component 35 samples the outputs from the respective individual diodes each time the x-ray tube 31 is pulsed, with a suitable sampling interval.

In the embodiment of FIG. 4, line 38 may be taken as representing a suitable covering layer which serves to ensure that the diodes 16–20 will remain properly electrically insulated from one another while accommodating the transmission of x-ray energy with minimum attenuation to the edge faces such as 21a–26a of the respective fluorescent layers. Line 39 in FIG. 4 on the other hand may represent a protective layer which serves to shield the detector from undesired radiation. The layer 39 may also include suitable visible light shielding, so that no visible light will impinge on the semiconductor layers such as 16 through 20 except the visible light from the respective adjacent fluorescent layer or layers.

Thus, as a general matter, each of the embodiments of FIGS. 2, 3 and 4 may be housed essentially in the manner of the known semiconductor detector of FIG. 1, x-ray and light shielding and desired mirror surfaces being provided by analogy with the known device, taking account in the case of FIG. 2 that x-ray energy is to be transmitted through a diode layer such as 4, and light energy is to be transmitted through the lower surface of diode 8, for example; the layer 14 at its lower surface thus having conditions analagous to the conditions for the lower surface of layer 1 in FIG. 1. The electrical output for the embodiment of FIG. 2 may correspond to that of FIG. 1, with the outputs from the semiconductor layers 4–8 being individually amplified if desired and combined to provide a single measure of impinging radiation, for example.

In the embodiment of FIG. 3, the lower surface of the detector of FIG. 3 is more nearly analagous to the desired conditions at the lower surface of semiconductor layer 1 of FIG. 1, having reference to the suitable housing of the detector stack of FIG. 3. The opposite end surfaces of the detector of FIG. 3 and the side surfaces as well as the bottom surface would be shielded from x-radiation and from visible light energy and would include means to ensure the electrical isolation of the individual diodes 16–20. Each diode such as 16 would have an individual electric circuit corresponding to the electric circuit of the known detector of FIG. 1, and the individual diodes would be connected with individual amplifiers and individual processing circuitry such as individual storage cells or the like. In this respect, the embodiment of FIG. 3 may correspond identically to the detector 32 of FIG. 4, and the detector 32 of FIG. 4 may correspond identically to that of FIG. 3, except for the fact of the curved longitudinal axis in detector 32 as compared with a linear or straight line longitudinal axis in FIG. 3. The detector of FIG. 3 would be particularly suitable for use in a tomographic apparatus wherein the x-ray beam was shifted at right angles to the beam direction so that the beam scanned in a direction parallel to the longitudinal axis of the detector of FIG. 3, the arrangement otherwise being similar to that shown in FIG. 4, the x-ray generator 34, not necessarily being pulsed during a linear scanning operation, however, but the cross section of the x-ray beam conforming, for example, to an edge face such as that indicated at 25a so that the beam sequentially impinges on the successive edge faces 25a, 21a, 22a, 23a, etc., during a linear scanning operation.

It will be apparent that many modifications and variations may be effected without departing from the scope of the novel concepts and teachings of the present invention.

We claim as our invention:

1. In an x-ray measuring arrangement with an x-ray tube having a focus and producing a fan-shaped x-ray beam extending from the focus for irradiating the entire cross section of a patient simultaneously, the x-ray tube being rotatable about the patient with the fan-shaped x-ray beam scanning a cross-section of the patient corresponding to the thickness of the fan-shaped x-ray beam, and a semiconductor x-ray detector curved about the focus of the x-ray tube and rotatable jointly with said x-ray tube about the patient, said detector comprising:

a plurality of fluorescent layers for converting the energy of the fan-shaped x-ray beam into light;

a plurality of separate light sensitive semiconductor diodes;

each member of said plurality of diodes is positioned between an associated pair of adjacent fluorescent layers forming an elongated row, each member of said plurality of fluorescent layers has an active edge directed toward the focus of the x-ray tube with each of said active edges of said fluorescent layers being equidistant from the focus and in the path of successive portions of said fan-shaped x-ray beam, each of said fluorescent layers has a pair of broad, spaced apart light-emitting faces directed longitudinally of said elongated row of semiconductor diodes and fluorescent layers and toward each of said adjacent semiconductor diodes, each of said semiconductor diodes has a pair of spaced apart, broad, light sensing surfaces directed longitudinally of said row and adjacent to respective fluorescent layers such that each said semiconductor diode receives activating light energy from said broad surfaces of a pair of adjacent fluorescent layers and generates an electrical output proportional to the sensed light energy.

* * * * *